US007612381B2

(12) United States Patent  
Kamiyama et al.

(10) Patent No.: US 7,612,381 B2  
(45) Date of Patent: Nov. 3, 2009

(54) METHOD FOR FABRICATING A SEMICONDUCTOR DEVICE AND SEMICONDUCTOR DEVICE

(75) Inventors: Satoshi Kamiyama, Nagoya (JP); Hiroshi Amano, Nagoya (JP); Motoaki Iwaya, Inazawa (JP); Isamu Akasaki, Nagoya (JP); Hideki Kasugai, Ama-gun (JP)

(73) Assignee: Meijo University, Nagoya-shi, Aichi-ken (JP)

( * ) Notice: Subject to any disclaimer, the term of this patent is extended or adjusted under 35 U.S.C. 154(b) by 170 days.

(21) Appl. No.: 11/710,744

(22) Filed: Feb. 26, 2007

(65) Prior Publication Data

US 2007/0145557 A1 Jun. 28, 2007

Related U.S. Application Data

(63) Continuation of application No. PCT/JP2005/015530, filed on Aug. 26, 2005.

(30) Foreign Application Priority Data

Aug. 31, 2004 (JP) .............................. 2004-251468

(51) Int. Cl.  
 *H01L 33/00* (2006.01)
(52) U.S. Cl. ............................ 257/79; 257/98; 257/103; 257/E33.067
(58) Field of Classification Search .................. 257/98, 257/787, 13, 94, 99, 100, E33.067, E33.068, 257/E33.005, 79, 103, 190; 438/29  
See application file for complete search history.

(56) References Cited

U.S. PATENT DOCUMENTS

| | | | | |
|---|---|---|---|---|
| 5,766,968 A | * | 6/1998 | Armacost et al. | ............ 438/398 |
| 6,091,083 A | * | 7/2000 | Hata et al. | ..................... 257/79 |
| 6,465,808 B2 | * | 10/2002 | Lin | ............................. 257/81 |
| 6,623,998 B2 | * | 9/2003 | Shibata et al. | ................. 438/22 |
| 6,821,804 B2 | * | 11/2004 | Thibeault et al. | .............. 438/29 |
| 6,825,056 B2 | * | 11/2004 | Asakawa et al. | .............. 438/47 |
| 7,053,420 B2 | * | 5/2006 | Tadatomo et al. | ............. 257/98 |

(Continued)

FOREIGN PATENT DOCUMENTS

JP     2003-086835     3/2003

(Continued)

OTHER PUBLICATIONS

Tada, Tetsuya, Kanayama, Toshihiko, "Regular array of Si nanopillars fabricated using metal clusters", Sep. 16, 1998, American Vacuum Society, JVST B, Nov./Dec. 1998, pg. 3934-3937.*

(Continued)

*Primary Examiner*—Sue Purvis  
*Assistant Examiner*—Scott Stowe  
(74) *Attorney, Agent, or Firm*—Yokoi & Co., U.S.A., Inc.; Peter Ganjian

(57) ABSTRACT

The present invention discloses a method for fabricating a semiconductor device, comprising: providing a translucent portion; forming a covering layer comprised of one or more metals on the translucent portion by vapor deposition; providing kinetic energy to the covering layer for forming a periodic mask; forming a periodic structure on the translucent portion by using the periodic mask.

1 Claim, 13 Drawing Sheets

U.S. PATENT DOCUMENTS

| | | | | |
|---|---|---|---|---|
| 7,154,121 | B2* | 12/2006 | Hsieh et al. | 257/79 |
| 2001/0010941 | A1* | 8/2001 | Morita | 438/46 |
| 2002/0195609 | A1* | 12/2002 | Yoshitake et al. | 257/81 |
| 2003/0178626 | A1* | 9/2003 | Sugiyama et al. | 257/79 |
| 2003/0181057 | A1* | 9/2003 | Sakai et al. | 438/712 |
| 2004/0227446 | A1* | 11/2004 | Fujimoto et al. | 313/110 |
| 2005/0006651 | A1* | 1/2005 | LeBoeuf et al. | 257/79 |
| 2006/0102914 | A1* | 5/2006 | Smits et al. | 257/98 |

FOREIGN PATENT DOCUMENTS

| | | |
|---|---|---|
| JP | 2003-174191 | 6/2003 |
| JP | 2003-218383 | 7/2003 |
| JP | 2003-258296 | 9/2003 |

OTHER PUBLICATIONS

The extended European search report includes, pursuant to Rule 62 EPC, the supplementary European search report (Art 1.53(7) EPC) and the European search opinion.

Huh C., et al: "Enhanced performances of InGaN-based light-emitting diode by a micro-roughened p-GaN surface using metal clusters", SPIE 2002.

Huh C., et al: "Improved light-output and electrical performance of InGaN-based light-emitting diode by microroughening of the p-GaN surface", Journal of Applied Physics Jun. 2003.

Ovchinnikov V., et al: "Silicon Nanopillars Formed by Reactive Ion Etching Using a Self-Organized Gold Mask", IEEE 2005.

Malinin A. A., et al: "Nanostructure fabrication process for optoelectronic application", SPIE 2000.

Aggarwal S, et al: "Oxide nanostructures through self-assembly", Applied Physics Letters Mar. 2001.

Chu J. T., et al: "Improvement of InGaN-GaN Light-Emitting Diode Performance With a Nano-Roughened p-GaN Surface", Physics Scripta 1999.

International Search Report for PCT/JP2005/015530 dated Nov. 22, 2005.

* cited by examiner

METHOD FOR FABRICATING A SEMICONDUCTOR DEVICE AND SEMICONDUCTOR DEVICE

CROSS-REFERENCES TO RELATED APPLICATIONS

This Application claims the benefit of priority and is a Continuation application of the prior International Patent Application No. PCT/JP2005/015530, with an international filing date of Aug. 26, 2005, which designated the United States, and is related to the Japanese Patent Application No. 2004-251468, filed Aug. 31, 2004, the entire disclosures of all applications are expressly incorporated by reference in their entirety herein.

BACKGROUND OF THE INVENTION (1) Field of the Invention

The present invention relates to a method for fabricating a semiconductor device and a semiconductor device.

(2) Description of Related Art

A semiconductor light-emitting element formed with a low-temperature deposition buffer layer (1986, H. Amano, N. Sawaki, I. Akasaki, and Y. Toyoda: Appl. Phys. Lett., 48 (1986) 353) has been proposed in the related art as this type of semiconductor light-emitting element. A semiconductor light-emitting element to which p-type conductivity control (1989, H. Amano, M. Kito, K. Hiramatsu, and I. Akasaki: Jpn. J. Appl. Phys. 28 (1989) L2112) and n-type conductivity control (1991, H. Amano and I. Akasaki: Mat. Res. Soc. Ext, Abst., EA-21 (1991) 165) are applied has also been proposed. A semiconductor light-emitting element created by applying a highly efficient light emitting layer fabricating method (1991, N. Yoshimoto, T. Matsuoka, T. Sasaki, and A. Katsui, Appl. Phys. Lett., 59 (1991) 2251) has also been proposed.

FIG. 13 shows an exemplary constitution of a group III nitride semiconductor light-emitting element serving as an example of a semiconductor light-emitting element to which the techniques described above are applied. In the drawing, a group III nitride semiconductor light-emitting element 1 comprises a sapphire substrate 2, and a low-temperature deposition buffer layer 3 is deposited on top of the sapphire substrate 2. An n-GaN cladding layer 4, a GaInN light-emitting layer 5, a p-AlGaN barrier layer 6, and a p-GaN contact layer 7 are deposited in succession on the low-temperature deposition buffer layer 3. A p-electrode 8 is deposited on the uppermost p-GaN contact layer 7, and an n-electrode 9 is deposited on the n-GaN layer, thereby forming the group III nitride semiconductor light-emitting element 1.

In a group III nitride semiconductor light-emitting element, represented by the semiconductor light-emitting element constituted as described above, blue light, green light, and white light can be emitted at high intensity. In other types of semiconductor light-emitting element such as AlGaInP and AlGaAs, for example, a substantially identical layer structure can be produced using a substrate having an appropriate lattice constant, and thus a high light-emission efficiency can be realized.

Even in a semiconductor light-emitting element having high light-emission efficiency, if the efficiency with which light is extracted to the outside of the semiconductor light-emitting element is poor, the overall energy conversion efficiency of the semiconductor light-emitting element is also poor. Hence, improvement of the light extraction efficiency is important. One of the causes of poor light extraction efficiency is a semiconductor refractive index which is larger than the refractive index of air. When the refractive index of the semiconductor is larger than the refractive index of air, a large amount of the light emitted by the light-emitting later is reflected totally, thereby becoming sealed in the interior of the semiconductor light-emitting element.

To solve this problem, a method of molding a semiconductor light-emitting element using an epoxy resin or the like having a refractive index between the refractive index of the semiconductor light-emitting element and the refractive index of air is known (see Semiconductor Elements, Revision, Tetsuro Ishida and Azuma Shimizu, Corona, 1980, for example). A method of improving the light extraction efficiency by forming a large number of protrusions at a peak period of 500 nm or more on the surface layer of the semiconductor light-emitting element is also known (see Japanese Unexamined Patent Application Publication 2003-174191, for example). According to the former constitution, the extreme refractive index difference between the semiconductor light-emitting element and air can be reduced, enabling a reduction in total reflection and an improvement in the light extraction efficiency. In the latter constitution, the emitted light is reflected diffusely by the surface irregularities and can therefore be extracted, enabling an improvement in the light extraction efficiency.

BRIEF SUMMARY OF THE INVENTION

The present invention discloses a method for fabricating a semiconductor device, comprising: providing a translucent portion; forming a covering layer comprised of one or more metals on the translucent portion by vapor deposition; providing kinetic energy to the covering layer for forming a periodic mask; and forming a periodic structure on the translucent portion by using the periodic mask.

Another optional aspect of the present invention provides a method for fabricating a semiconductor device, wherein: the periodic mask is used as an etching mask.

One optional aspect of the present invention provides a method for fabricating a semiconductor device, wherein: the periodic mask is used as a crystal growth mask.

Another optional aspect of the present invention provides a method for fabricating a semiconductor device, wherein: the kinetic energy is provided for selective reduction in effective volume of the covering layer.

One optional aspect of the present invention provides a method for fabricating a semiconductor device, wherein: the covering layer is comprised of Au.

Another optional aspect of the present invention provides a method for fabricating a semiconductor device, further including: forming a highly reflective metallic layer on the periodic mask.

One optional aspect of the present invention provides a semiconductor device fabricated by a method, comprising: providing a translucent portion; forming a covering layer comprised of one or more metals on the translucent portion by vapor deposition; providing kinetic energy to the covering layer for forming a periodic mask; and forming a periodic structure on the translucent portion by using the periodic mask.

Another optional aspect of the present invention provides a semiconductor device, comprising: a translucent portion; and a periodic structure comprised of a plurality of juts distributed randomly on a surface of the translucent portion, with the periodic structure having space period lengths with a first standard deviation that is smaller than 20% of average length of the space periods.

One optional aspect of the present invention provides a semiconductor device, wherein: the average length of the space periods is shorter than twice of an average optical wavelength of a light through the translucent portion.

Another optional aspect of the present invention provides a semiconductor device, wherein: the light through the translucent portion is emitted by a semiconductor layer included in the semiconductor device.

One optional aspect of the present invention provides a semiconductor device, wherein: an average height of the juts is greater than the average optical wavelength.

Another optional aspect of the present invention provides a semiconductor device, wherein: a second standard deviation in heights of the juts is smaller than 20% of the average height of the juts.

One optional aspect of the present invention provides a semiconductor device, wherein: the translucent portion is a substrate.

Another optional aspect of the present invention provides a semiconductor device, wherein: the translucent portion substrate is comprised of SiC.

One optional aspect of the present invention provides a semiconductor device, wherein: the periodic structure is formed on a surface on an opposite side of the substrate to a side on which the semiconductor layer is deposited.

Another optional aspect of the present invention provides a semiconductor device, wherein: a group III nitride semiconductor layer is deposited between a substrate and the semiconductor layer, and the periodic structure is formed on an interface between the substrate and the group III nitride semiconductor layer.

One optional aspect of the present invention provides a semiconductor device, wherein: the translucent portion is a sealing portion that seals the semiconductor device.

Another optional aspect of the present invention provides a semiconductor device, wherein: the sealing portion completely seals the semiconductor device.

One optional aspect of the present invention provides a semiconductor device, wherein: the sealing portion partially seals the semiconductor device.

Another optional aspect of the present invention provides a semiconductor device, wherein: the juts are formed in a substantially pyramidal shape.

One optional aspect of the present invention provides a semiconductor device, wherein: a highly reflective metallic layer is formed on the periodic structure.

Another optional aspect of the present invention provides a semiconductor device, wherein: the highly reflective metallic layer constitutes an electrode.

One optional aspect of the present invention provides a semiconductor device, comprising: a first semiconductor layer having a first side and a second side with the first semiconductor layer having a translucent property; a low temperature deposition buffer layer on the first side of the first semiconductor layer; a cladding layer on the low temperature deposition buffer layer; a light emitting layer on the cladding layer; a barrier layer on the light emitting layer; a contact layer on the barrier layer, with the light emitting layer, the barrier layer, and the contact layer selectively etched for exposing part of the cladding layer; a n-type electrode on the exposed part of the cladding layer; and a p-type electrode on the contact layer.

Another optional aspect of the present invention provides a semiconductor device, wherein: the second side of the first semiconductor layer is comprised of a periodic structure that is comprised of a plurality of juts.

One optional aspect of the present invention provides a semiconductor device, wherein: an average distribution space period of the juts is greater than a standard deviation of the distribution space period.

One optional aspect of the present invention provides a semiconductor device, wherein: an average heights of the juts is greater than a standard deviation of the average heights of the juts.

One optional aspect of the present invention provides a semiconductor device, wherein: the juts are formed by etching the second side of the first semiconductor layer using a periodic mask that is resistant to etching medium.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

(1) First Embodiment

Figure 1:
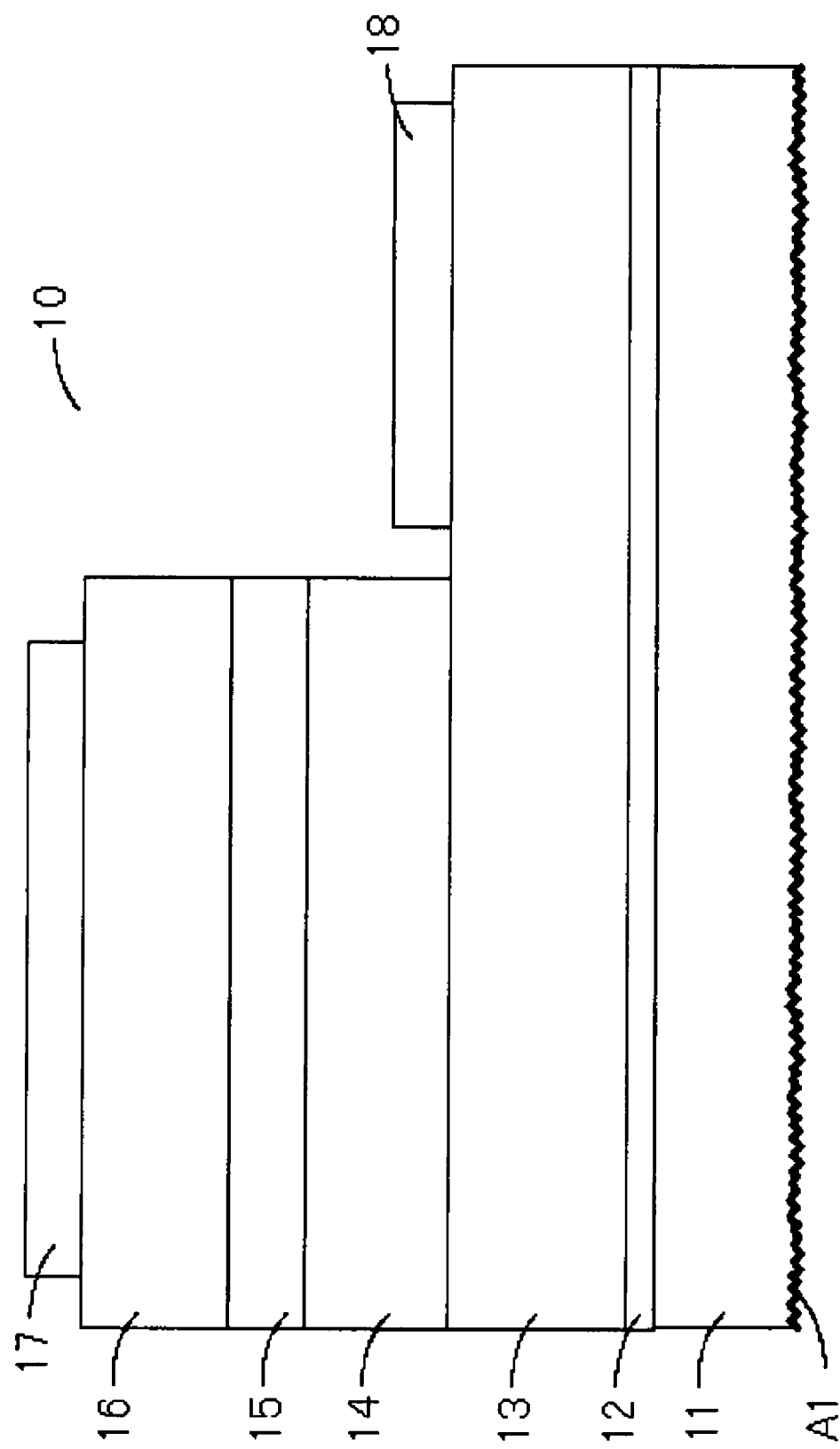
FIG. 1 is an exemplary schematic diagram of a semiconductor light-emitting element according to a first embodiment.

FIG. 1 shows an exemplary outline of the structure of a group III nitride semiconductor light-emitting element as a semiconductor device according to a first embodiment of the present invention. In the drawing, a semiconductor light-emitting element 10 is constituted by a substrate 11 as a translucent portion, a low-temperature deposition buffer layer 12, a cladding layer 13, a light-emitting layer 14, a barrier layer 15, a contact layer 16, a p-electrode 17, and an n-electrode 18, all of which are formed in a substantially plate-shaped form. In the drawing, the plate-form substrate 11 constituting the lowermost layer is consisted of SiC. The low-temperature deposition buffer layer 12 consisted of AlGaN (a group III nitride semiconductor), the cladding layer 13 consisted of n-GaN, the light-emitting layer 14 consisted of GaInN, the barrier layer 15 consisted of p-AlGaN, and the contact layer 16 consisted of p-GaN are deposited in succession onto the front side surface of the substrate 11. The plate-form p-electrode 17 is deposited onto the contact layer 16 constituting the uppermost layer, and the n-electrode 18 is deposited on the cladding layer 13. Periodic irregularities are formed on the back side of the substrate 11. Note that the section extending from the cladding layer 13 consisted of n-GaN to the contact layer 16 consisted of p-GaN constitutes a light-emitting portion of the present invention.

Figure 2:
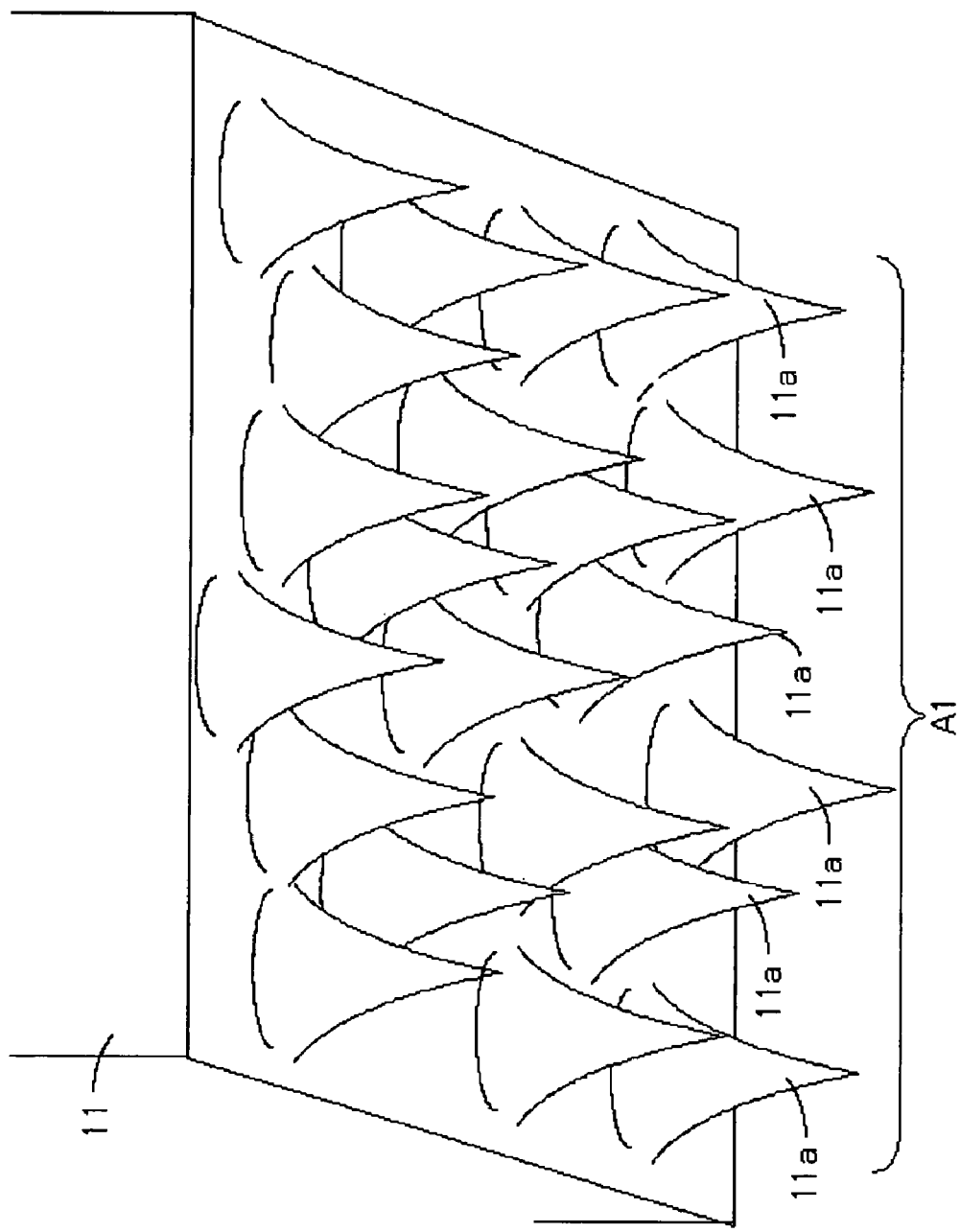
FIG. 2 is an exemplary perspective view of a periodic structure according to the first embodiment.

FIG. 2 shows an exemplary back side (the opposite surface to the surface on which the light-emitting portion is deposited) of the substrate 11 seen diagonally. In the drawing, the back surface of the substrate 11 takes an indented form created by forming a large number of substantially conical juts 11a, 11a, 11a, . . . thereon so as to protrude downward from the back side of the substrate 11. Note that the juts 11a, 11a, 11a, . . . are distributed periodically in a two-dimensional direction on the back surface of the substrate 11, and are referred to collectively as a periodic structure A1. The average height of the juts 11a, 11a, 11a, . . . is approximately 300 nm, and the standard deviation thereof is approximately 20 nm. Note that the heights of the juts 11a, 11a, 11a, . . . are assumed to be the difference between the peak heights and base heights of the juts 11a, 11a, 11a, . . . . The average distribution space period of the juts 11a, 11a, 11a, . . . is approximately 200 nm, and the standard deviation of this distribution space period is approximately 15 nm. Note that the interval between the peaks of adjacent juts 11a, 11a, 11a, . . . will be referred to as the distribution space period of the juts 11a, 11a, 11a, . . . or the average period of the periodic structure A1.

In this constitution, light can be emitted from the light-emitting layer 14 when a voltage is applied in a forward bias direction between the p-electrode 17 and n-electrode 18 of the semiconductor light-emitting element 10. In the light-emitting layer 14, light is emitted at a wavelength corresponding to the band gap thereof In the light-emitting portion of this embodiment, the average optical wavelength of the light is approximately 220 nm. Note that the optical wavelength is a value obtained by dividing the actual wavelength by the refractive index. Further, the wavelength of the light emitted by the light-emitting layer 14 is distributed within a wavelength bandwidth of several tens of nm, and the average value thereof is approximately 220 nm. The substrate 11, low-temperature deposition buffer layer 12, cladding layer 13, barrier layer 15, and contact layer 16 each possess a translucency, and hence the light emitted by the light-emitting layer 14 can be extracted from the back side of the substrate 11. In other words, the back surface of the substrate 11 serves as a light extraction surface of the semiconductor light-emitting element 10, and the light that is extracted from the extraction surface can be used for illumination and so on.

The light emitted from the light-emitting layer 14 penetrates the periodic structure A1 formed on the back surface of the substrate 11, and is discharged into the air on the exterior of the semiconductor light-emitting element 10. The refractive index of the light is different in the air on the exterior of the semiconductor light-emitting element 10 and in the substrate 11 consisted of SiC, and hence the interface between the periodic structure A1 and the air forms a reflective surface. Accordingly, light which enters the interface between the periodic structure A1 and the air at an angle of incidence which exceeds a critical angle may be reflected on the interface and become sealed in the interior of the semiconductor light-emitting element 10. However, in the present invention, the average period (approximately 200 nm) of the periodic structure A1 is smaller than the optical wavelength (approximately 220 nm) of the emitted light, and hence the majority of the light that reaches the periodic structure A1 feels a refractive index between that of the air and that of the substrate 11.

The refractive index on the periodic structure A1 may be considered to vary in accordance with the surface area ratio of the air which is distributed over a sliced surface obtained by slicing the periodic structure A1 in a parallel direction to the back surface of the substrate 11. In actuality, the air and the SiC of the substrate 11 are distributed non-uniformly over the sliced surface, but this non-uniform distribution exists in a shorter period than the average optical wavelength, and hence the majority of the light feels an intermediate refractive index that is dependent on the surface area ratio. On the sliced surface near the base of the periodic structure A1, the surface area ratio occupied by the air is small, and hence the refractive index of the substrate 11 contributes greatly at the height near the base of the periodic structure A1. Conversely, on the sliced surface near the peak of the periodic structure A1, the surface area ratio occupied by the air is large, and hence the refractive index of the air contributes greatly at the height of the peak of the periodic structure A1. In short, the periodic structure A1 may be considered to have a refractive index (effective refractive index) which converges gradually toward the refractive index of the air from the refractive index of the substrate 11 as the light advances more deeply in the height direction of the periodic structure A1.

The transition of the refractive index corresponding to the height of the periodic structure A1 depends on the shape of the juts 11a, 11a, 11a, . . . . For example, when the juts 11a, 11a, 11a, . . . incline linearly, as in this embodiment, the refractive index may be considered to vary in a continuous parabola. As a result, dramatic variation in the refractive index on the periodic structure A1, which constitutes the interface between the substrate 11 and the air, can be prevented, and light can be prevented from being reflected by the periodic structure A1. Note, however, that the shape of the juts 11a, 11a, 11a, . . . is not limited to a conical shape, and the effects of the present invention can be exhibited with other shapes. In other words, any shape having a sectional area which varies gradually in accordance with the height may be employed, and accordingly the protrusions may be provided in the shape of triangular pyramids, quadrangular pyramids, hemispheres, or trapezoids, for example.

The height (approximately 400 nm) of the periodic structure A1 in this embodiment is greater than the average optical wavelength of the light (approximately 220 nm) and the average period (approximately 200 nm), and hence the angle at which the incline of the juts 11a, 11a, 11a, . . . intersects the substrate 11 can be set to a comparatively large angle (near 90 degrees). By forming the periodic structure A1 to be high, dramatic variation in the refractive index can be prevented even in relation to light which enters the formation surface of the periodic structure A1 at a shallow angle. Further, by forming the periodic structure A1 to be high, the surface area ratio varies gently in accordance with the height of the periodic structure A1, and the gradient of linear variation in the refractive index can be reduced. In other words, dramatic variation in the refractive index can be suppressed, and a high reflection prevention ability can be realized.

Figure 3:
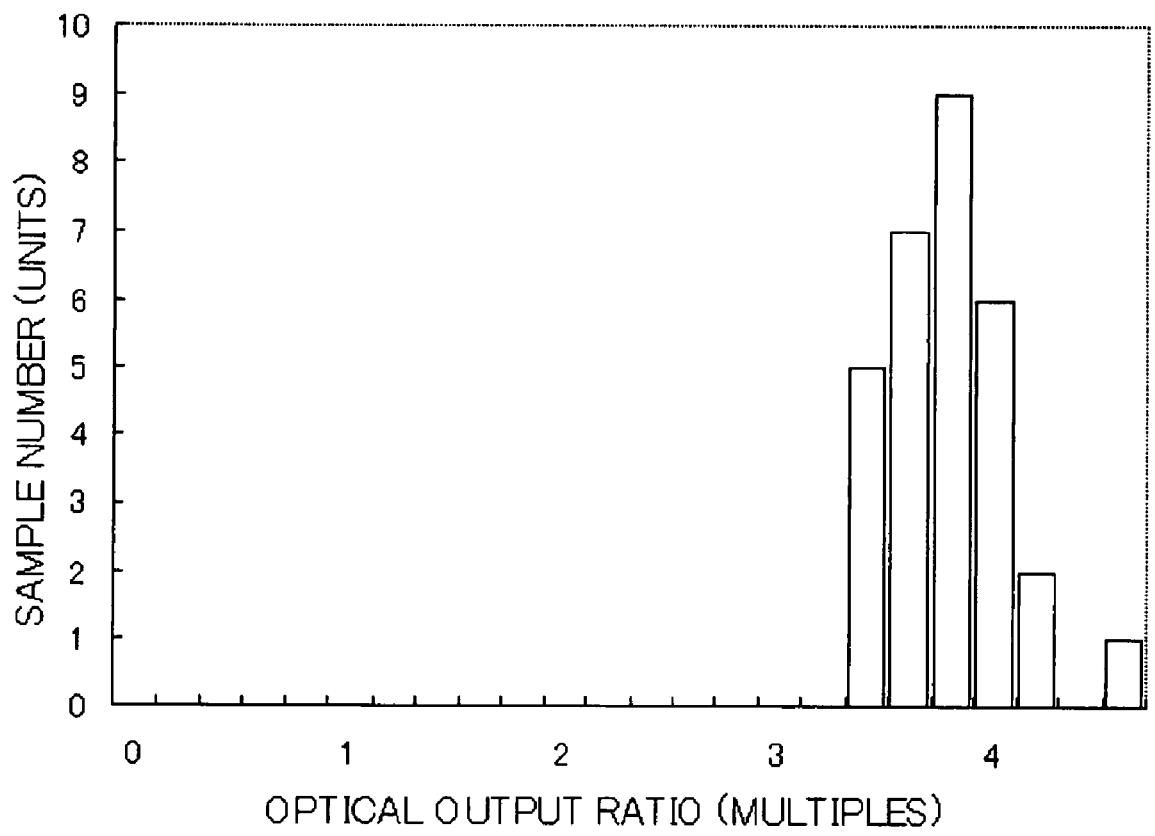
FIG. 3 is an exemplary histogram showing the light output of the semiconductor light-emitting element to which the present invention is applied.
Figure 13:
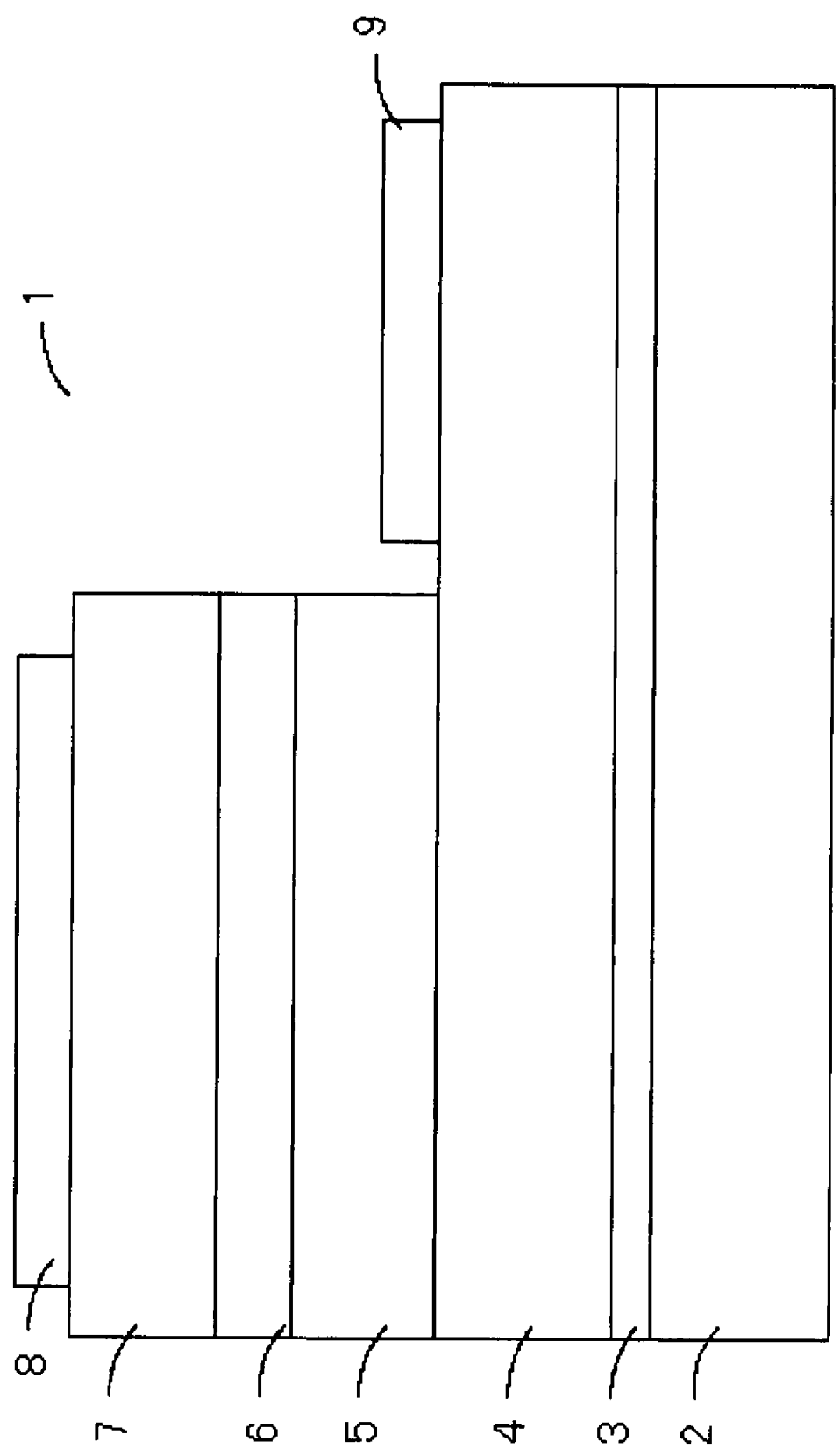
FIG. 13 is an exemplary schematic diagram of a semiconductor light-emitting element according to a conventional example.

FIG. 3 illustrates exemplary effects of the present invention in the form of a histogram. In the drawing, the abscissa shows a ratio between the light output of the present invention, formed as shown in FIG. 1, and the light output of a conventional semiconductor light-emitting element formed as shown in FIG. 13. The ordinate shows the number of samples corresponding to each light output ratio. Note that the light output was checked on 30 semiconductor light-emitting elements according to the present invention. It was found that with the samples to which the present invention was applied, a light output between 3.4 and 4.6 times (mode: 3.8 times) greater than the conventional semiconductor light-emitting element was obtained. It was also found that electric energy input into the semiconductor light-emitting element 10 could be extracted as optical energy with substantially no loss.

As noted above, the effects of the present invention are exhibited when the average period of the periodic structure A1 is smaller than the average optical wavelength of the light, but by setting the standard deviation of the distribution space period of the juts 11a, 11a, 11a, . . . within 20% (preferably within 10%) of the average period of the periodic structure A1, the effects of the present invention can be exhibited with certainty. Further, the standard deviation of the distribution space period of the juts 11a, 11a, 11a, . . . is preferably as small as possible, but there is no need to form the juts 11a, 11a, 11a, . . . regularly in a lattice shape or the like, for example. Note, however, that the juts 11a, 11a, 11a, . . . are preferably distributed on the back surface of the substrate 11 in a two-dimensional direction in order to prevent anisotropy in effects of the present invention. The periodic structure A1 may of course be formed in striped form, even though anisotropy occurs as a result. Further, variation in the height of the juts 11a, 11a, 11a, . . . is preferably held within 20% (more preferably within 10%) of the average.

Figure 4:
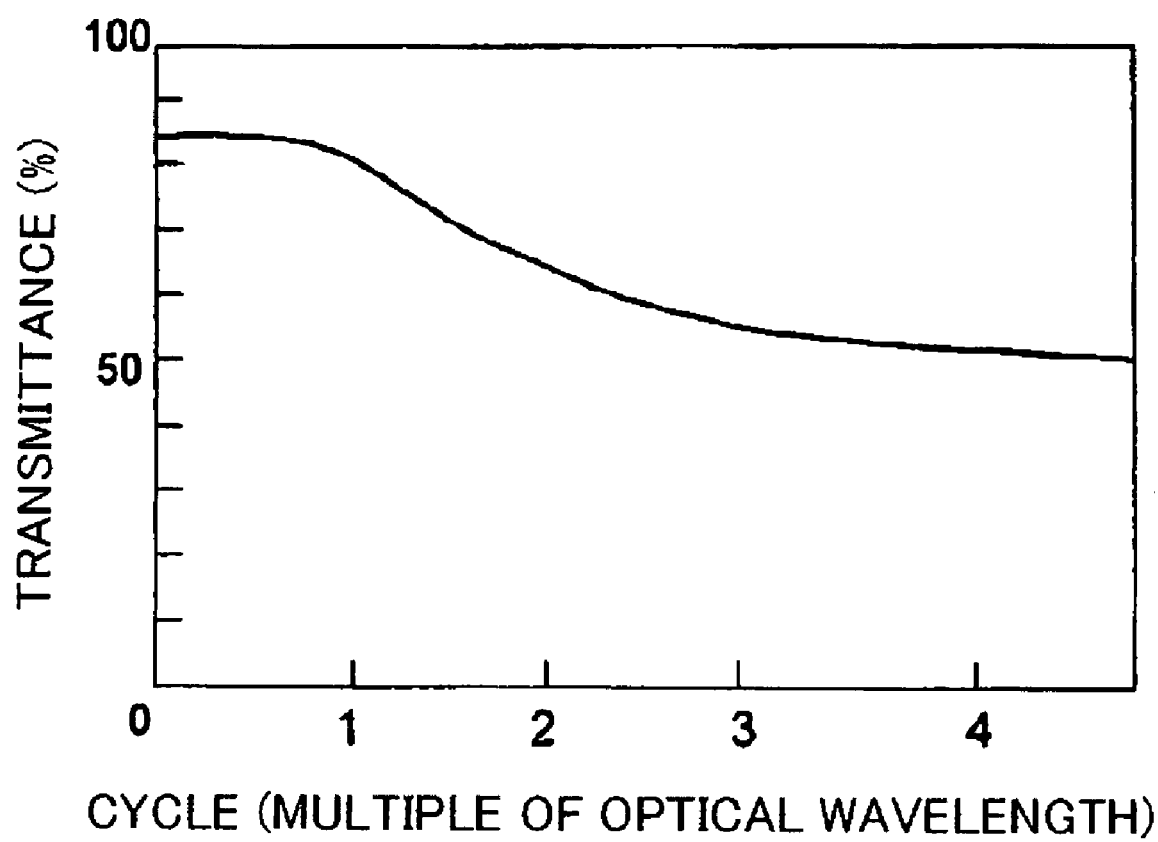
FIG. 4 is an exemplary graph showing the relationship between optical transmittance and an average period.

FIG. 4 shows an exemplary transmittance on the interface between the substrate 11 and the air in the form of a graph. In the diagram, the ordinate shows the optical transmittance and the abscissa shows the average period of the periodic structure A1. Note that the average period of the periodic structure A1 shown on the abscissa is expressed as a multiple of the average optical wavelength (approximately 220 nm) of the emitted light. As is evident from the diagram, the transmittance improves in a region where the average period of the periodic structure A1 is approximately 500 nm or less, i.e. 3 times the average optical wavelength (approximately 220 nm) or less. In a region where the average period of the periodic structure A1 is double the average optical wavelength or less, a particularly high light extraction efficiency can be realized in the semiconductor light-emitting element 10. By making the average period of the periodic structure A1 equal to or less than the average optical wavelength, as in this embodiment, an optical transmittance of almost 100% can be realized. In other words, the average period of the periodic structure A1 is preferably as small as possible.

The light emitted from the light-emitting layer 14 has an average optical wavelength of approximately 220 nm but a wavelength bandwidth of several tens of nm, and hence as the average period of the periodic structure A1 decreases, the proportion of the emitted light that has a smaller optical wavelength than the period of the periodic structure A1 increases. Accordingly, the optical transmittance can be raised gradually from the region in which the average period of the periodic structure A1 is between 2 and 3 times greater than the average optical wavelength of the emitted light, and brought close to 100% in the region where the average period of the periodic structure A1 is equal to or lower than the average optical wavelength of the emitted light.

Next, a fabricating method for the semiconductor light-emitting element 10 will be described. First, the substantially plate-form substrate 11 is prepared. Note that at this point in time, the periodic structure A1 is not formed on the back side of the substrate 11. The low-temperature deposition buffer layer 12 is formed at a predetermined thickness by growing AlGaN uniformly on the front side of the substrate 11 using a metal-organic chemical vapor deposition method. In a similar fashion, the cladding layer 13 is formed on the low-temperature deposition buffer layer 12 and the light-emitting layer 14 is formed on the cladding layer 13. The barrier layer 15 is then formed on the light-emitting layer 14, whereupon the contact layer 16 is formed by growing p-GaN on the barrier layer 15.

Figure 5:
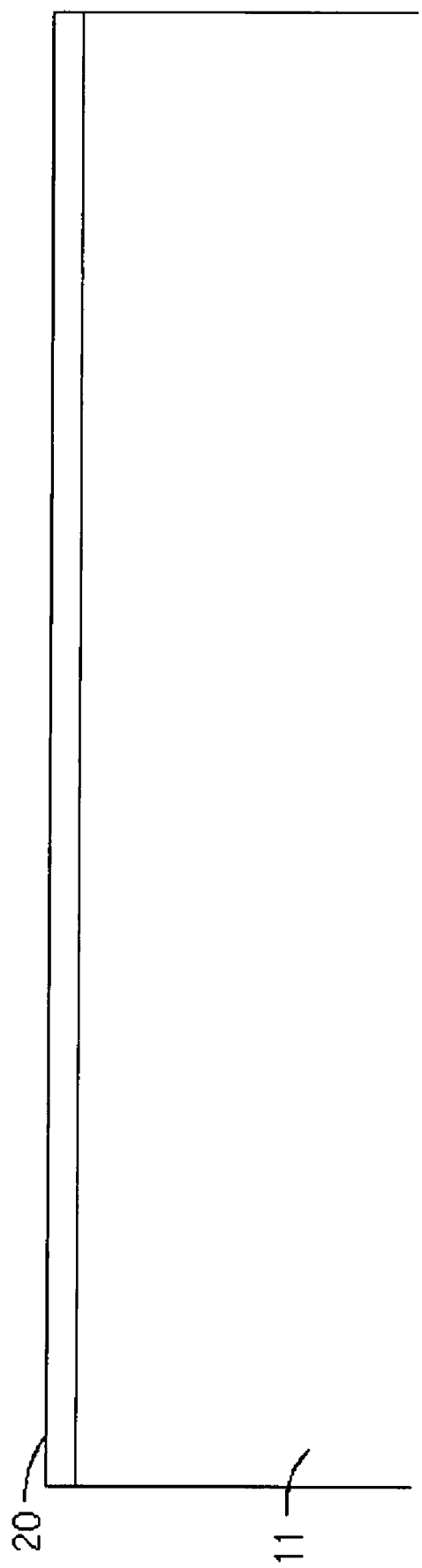
FIG. 5 is an exemplary process diagram of a periodic structure according to the first embodiment.

After depositing the various layers in the manner described above, a covering layer 20 is formed on the back side of the substrate 11 by applying Au evenly thereto as a covering material through vapor deposition, as shown in FIG. 5 (vapor deposition). Various vapor deposition methods may be applied to deposit the Au. For example, an EB vapor deposition apparatus which performs vapor deposition by heating the Au in a vacuum to cause the Au to transpire may be used. Further, the Au may be applied using a wet method, for example, as long as the Au can be distributed with a certain degree of uniformity over the back side of the substrate 11. Note that in this embodiment, vapor deposition is performed such that the film thickness of the covering layer 20 is approximately 50 Å (50 m$^{-10}$).

Figure 6:
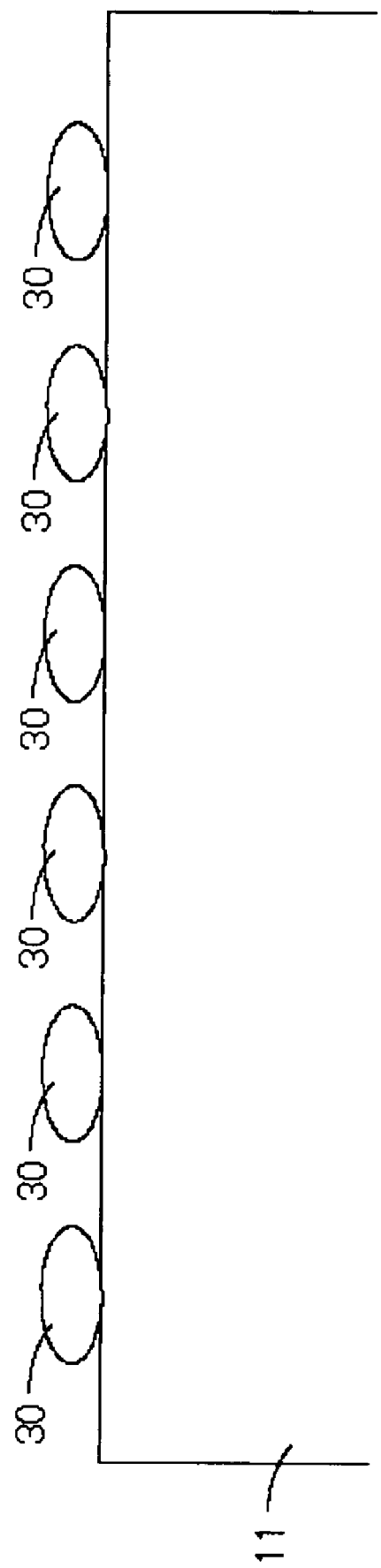
FIG. 6 is an exemplary process diagram of the periodic structure according to the first embodiment.

After forming the covering layer 20, the semiconductor light-emitting element 10 is heated in an oven or the like (kinetic energy providing step for selective reduction in effective volume of the covering layer 30). At this time, the covering layer 20 formed on the back side of the substrate 11 is heated evenly to approximately 180° C., for example, over the entire surface of the covering layer 20. In so doing, kinetic energy can be applied to each of the Au atoms constituting the covering layer 20, and as a result, the Au atoms can be agglomerated on the back side surface of the substrate 11. Then, by cooling the semiconductor light-emitting element 10, a large number of Au particles 30, 30, 30, . . . can be distributed over the back side surface of the substrate 11, as shown in FIG. 6. The covering layer 20 is formed at an even film thickness and kinetic energy is applied evenly over the entire surface, as described above, and therefore the cohesive energy of the Au atoms may be considered uniform over the entire back side of the substrate 11. Accordingly, the Au particles 30, 30, 30, . . . can be distributed at even periods over the back side surface of the substrate 11, as shown in FIG. 6.

Note that the distribution space period of the Au particles 30, 30, 30, . . . may be controlled in accordance with the heating temperature, the film thickness of the covering layer 20, and so on. In this embodiment, the covering layer 20 having a film thickness of approximately 50 Å (50 m$^{-10}$) is heated to approximately 180° C., whereby the Au particles 30, 30, 30, . . . can be distributed in an average period of approximately 200 nm. To increase the distribution space period of the Au particles 30, 30, 30, . . . , the heating temperature may be raised or the film thickness of the covering layer 20 may be increased, for example. Conversely, to reduce the distribution space period of the Au particles 30, 30, 30, . . . , the heating temperature may be lowered or the film thickness of the covering layer 20 may be decreased. Further, as long as kinetic energy can be applied to the covering layer 20 to the extent that the Au atoms can be agglomerated, the periodic Au particles 30, 30, 30, . . . may be formed using a method other than heating. For example, kinetic energy may be applied to the covering layer through ion irradiation, electron irradiation, and so on. Note that the Au particles 30, 30, 30, . . . form a periodic pattern having an average period which is equal to or lower than the average optical wavelength, and hence as a whole, the Au particles 30, 30, 30, . . . constitute a periodic mask of the present invention (mask forming step).

After forming the Au particles 30, 30, 30, . . . so as to be distributed periodically over the back side surface of the substrate 11 in the manner described above, the back side of the substrate 11 is etched using a reactive ion etching apparatus (etching step). In this embodiment, $CF_4$ gas is used as an etching medium. Needless to say, another etching gas may be used, or etching may be performed using an etching liquid. The etching resistance of Au to $CF_4$ gas is higher than the etching resistance of SiC to $CF_4$ gas, and hence the SiC may be etched selectively. The etching direction is perpendicular to the back surface of the substrate 11, and etching may be performed only on the parts of the back side surface of the substrate 11 to which the Au particles 30, 30, 30, . . . are not adhered.

Figure 8:
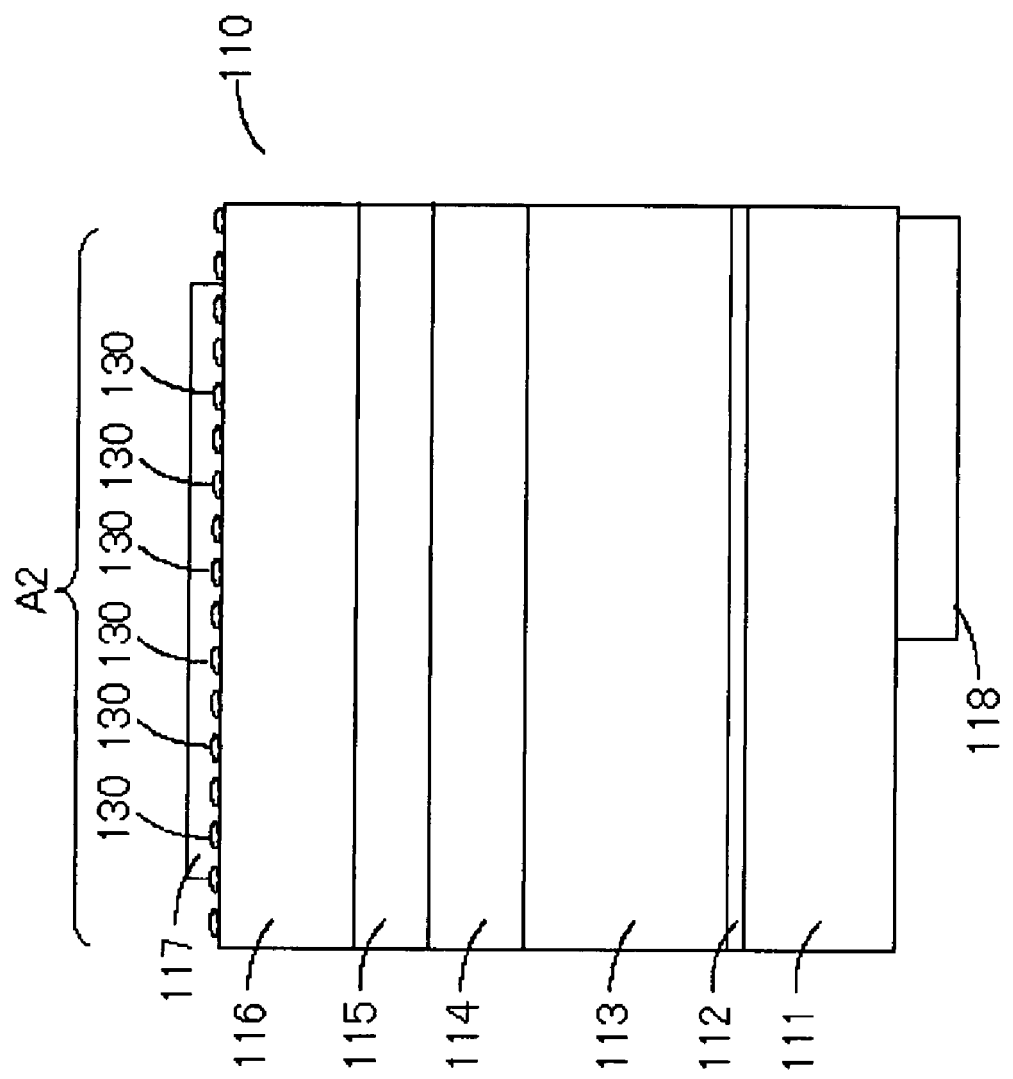
FIG. 8 is an exemplary schematic diagram of a semiconductor light-emitting element according to a second embodiment.

More specifically, etching may be performed using the periodic mask constituted by the large number of Au particles 30, 30, 30, . . . as an etching resist. In so doing, the periodic structure A1 may be formed as shown in FIG. 8 (periodic structure forming step). Note that by increasing the etching speed, etching typically progresses perpendicular to the back surface of the substrate 11, and as a result the angle of incline of the juts 11a, 11a, 11a, . . . becomes almost perpendicular to the back surface of the substrate 11. Conversely, by reducing the etching speed, side etching is performed, and hence the angle of incline of the juts 11a, 11a, 11a, . . . becomes an acute angle in relation to the back surface of the substrate 11.

Figure 7:
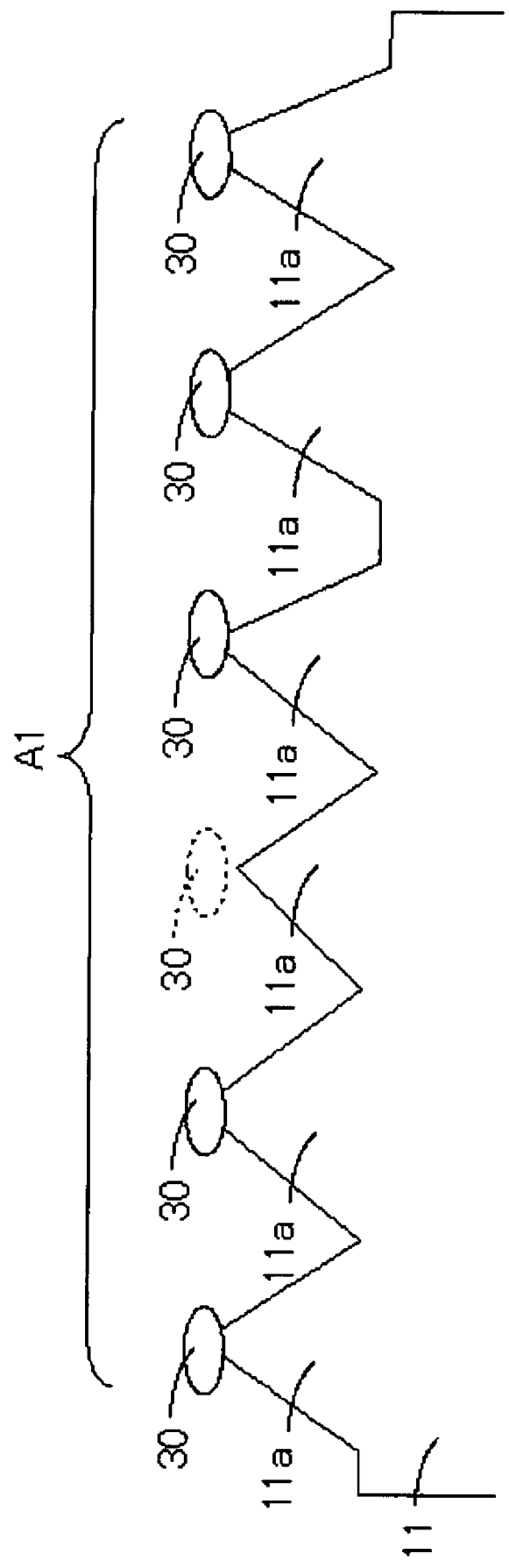
FIG. 7 is an exemplary process diagram of the periodic structure according to the first embodiment.

By performing etching using the periodic mask in this manner, the shape of the periodic structure A1 can be controlled to a desired shape. Furthermore, as long as etching is not performed excessively, the peaks of the juts 11a, 11a, 11a, . . . can be aligned in height. As a result, variation in the height of the juts 11a, 11a, 11a, . . . can be reduced. Note that the amount of side etching may be increased intentionally to remove the Au particle 30, as shown on the third protruding portion 11a from the left in FIG. 7. Furthermore, the etching conditions may be set such that the Au particle 30 is removed by etching. Note that in this embodiment, the performance of the semiconductor light-emitting element 10 is not greatly diminished even when the Au particles 30, 30, 30, . . . remain in the interior of the semiconductor light-emitting element 10. However, the performance may be diminished depending on the material of the covering layer, and in such a case the periodic mask is preferably removed.

The material of the periodic mask is not limited to Au, and any material may be used as long as the etching resistance to the etching medium is greater than that of the substrate. Specifically, the etching selection ratio between the periodic mask and the substrate is preferably at least 0.1, and more preferably at least 1. Examples of periodic mask materials that are effective in relation to $CF_4$ gas include Ga, In, Al, Cu, Ag, Ni, Pt, Pd, SiN, $SiO_2$, or an insulator. An appropriate periodic mask material is selected in accordance with the etching medium, and hence it goes without saying that other periodic mask materials may be applied. Note, however, that when atom or molecule agglomeration is employed in the periodic mask forming step, as in this embodiment, a gatherable covering material such as Au must be selected.

Furthermore, in this embodiment the periodic mask is formed using agglomeration of the covering layer, but a periodic mask may be formed using another method. For example, a periodic mask pattern may be formed using a stepper employing an excimer laser. Alternatively, a periodic mask pattern may be formed by subjecting a photosensitive mask material to electron beam exposure and so on or two-beam interference exposure.

After forming the periodic structure A1 in the manner described above, the p-electrode 17 and n-electrode 18 are formed and the semiconductor light-emitting element 10 is packaged. Note that the cladding layer 13 may be exposed by selectively etching the uniformly deposited light-emitting layer 14, barrier layer 15, and contact layer 16 to form the n-electrode 18, or the cladding layer 13 may be exposed by selectively growing the light-emitting layer 14, barrier layer 15, and contact layer 16 in advance to form the n-electrode 18. Further, the periodic structure A1 may be formed after forming the n-electrode 17 and n-electrode 18.

Further, the various layers may be formed on the front side of the substrate 11 after forming the periodic structure A1 on the back side of the substrate 11 in advance. Moreover, the substrate 11 may be consisted of a material other than SiC as long as it possesses a translucency. For example, a sapphire substrate, a GaN substrate, a $Ga_2O_3$ substrate, a GaN substrate, and so on may be applied. Needless to say, the present invention is also applicable to another type of semiconductor light-emitting element such as AlGaInP or AlGaAs, for example. Note that the average optical wavelength of the emitted light varies according to the type of light-emitting layer, but as long as the periodic structure A1 is formed in a period which is double the average optical wavelength or less (preferably no greater than the average optical wavelength), a high light extraction efficiency can still be realized.

(2) Second Embodiment

FIG. 8 shows an exemplary outline of the structure of a group III nitride semiconductor light-emitting element as a semiconductor device according to a second embodiment of the present invention. In the drawing, a semiconductor light-emitting element 110 is constituted by a substrate 111 as a translucent portion, a low-temperature deposition buffer layer 112, a cladding layer 113, a light-emitting layer 114, a barrier layer 115, a contact layer 116, a p-electrode 117, and an n-electrode 118, all of which are formed in a substantially plate-shaped form. The plate-form substrate 111 constituting the lowermost layer is consisted of SiC. The low-temperature deposition buffer layer 112 consisted of AlGaN, the cladding layer 113 consisted of n-GaN, the light-emitting layer 114 consisted of GaInN, the barrier layer 115 consisted of p-AlGaN, and the contact layer 116 consisted of p-GaN are deposited in succession onto the front side surface of the substrate 111. A periodical structure A2 constituted by periodically arranged Au particles 130, 130, 130, . . . is provided on the uppermost contact layer 116, and a highly reflective metallic layer consisted of Cu and serving as the p-electrode 117 is deposited onto the contact layer 116 formed with the periodical structure A2. The back side of the substrate 111 is a flat surface, and the n-electrode 118 is deposited thereon.

With this constitution, light can be emitted from the light-emitting layer 114 by applying a voltage to the semiconductor light-emitting element 110 in a forward bias direction. In the light-emitting layer 114, light is emitted in accordance with the band gap thereof, and the average optical wavelength of the light is approximately 220 nm. The substrate 111, low-temperature deposition buffer layer 112, cladding layer 113, barrier layer 115, and contact layer 116 each possess a translucency, and hence the light emitted by the light-emitting layer 114 can be extracted from the back side of the substrate 111. In other words, the back side of the substrate 111 serves as a light extraction surface of the semiconductor light-emitting element 110, and the light that is extracted from the extraction surface can be used for illumination and so on.

Meanwhile, the upper surface of the contact layer 116 is covered by the p-electrode 117, which is consisted of highly reflective Cu, and by reflecting the emitted light, the light is prevented from leaking from the p-electrode 117 side. The reflected light can be extracted from the light extraction surface and used for illumination and so on. By forming the periodical structure A2, diffuse reflection can be promoted, and hence the reflectance on the interface between the contact layer 116 and the p-electrode 117 can be improved. As a result, the amount of light that is ultimately extracted from the light extraction surface of the semiconductor light-emitting element 110 can be increased, enabling an improvement in the light extraction efficiency to approximately 1.3 times the normal light extraction efficiency.

Next, a fabricating method for the semiconductor light-emitting element 110 will be described. First, the substantially plate-form substrate 111 is prepared. The low-temperature deposition buffer layer 112 is then formed at a predetermined thickness by growing AlGaN uniformly on the front side of the substrate 111 using a metal-organic chemical vapor deposition method. In a similar fashion, the cladding layer 113 is formed on the low-temperature deposition buffer layer 112 and the light-emitting layer 114 is formed on the cladding layer 113. The barrier layer 115 is then formed on the light-emitting layer 114, whereupon the contact layer 116 is formed by growing p-GaN on the barrier layer 115.

After depositing the various layers in the manner described above, a similar covering layer to that of FIG. 5 is formed on the surface of the contact layer 116 by applying Au evenly thereto as a covering material through vapor deposition. Various vapor deposition methods may be applied to deposit the Au. For example, an EB vapor deposition apparatus which performs vapor deposition by heating the Au in a vacuum to cause the Au to transpire may be used. Further, the Au may be applied using a wet method, for example, as long as the Au can be distributed with a certain degree of uniformity over the surface of the contact layer 116. Note that in this embodiment, vapor deposition is performed such that the film thickness of the covering layer is approximately 50 Å (50 m$^{-10}$).

After forming the covering layer, the semiconductor light-emitting element 110 is heated in an oven or the like. At this time, the covering layer formed on the surface of the contact layer 116 is heated to approximately 180° C., for example. In so doing, kinetic energy can be applied to each of the Au atoms constituting the covering layer, and as a result, the Au atoms can be agglomerated on the surface of the contact layer 116. Then, by cooling the semiconductor light-emitting element 110, a large number of Au particles 130, 130, 130, . . . can be distributed over the surface of the contact layer 116. As described above, the covering layer is formed at an even film thickness, and the cohesive energy of the Au atoms which agglomerate during heating may be considered uniform over the surface of the contact layer 116. Accordingly, the Au particles 130, 130, 130, . . . can be distributed in a uniform periodical form on the surface of the contact layer 116, similarly to FIG. 6.

After forming the Au particles 130, 130, 130, . . . so as to be distributed periodically over the surface of the contact layer 116 in the manner described above, Cu is applied to the contact layer 116 and the Au particles 130, 130, 130, . . . through vapor deposition (highly reflective metallic layer forming step). An EB vapor deposition apparatus or the like may be used here to deposit the Cu, or Cu may be applied to the surface of the contact layer 116 using a method other than vapor deposition. In the initial stage of vapor deposition, the Au particles 130, 130, 130, . . . form irregularities on the surface of the contact layer 116, but as vapor deposition progresses, the gaps between the Au particles 130, 130, 130, . . . are filled by the Cu such that eventually a flat surface is formed as the p-electrode 117. In other words, a highly reflective metallic layer is formed as the p-electrode 117 so as to contact the interface with the periodical structure constituted by the Au particles 130, 130, 130, . . . .

The substrate of this embodiment may be consisted of a material other than SiC as long as it possesses a translucency. For example, a sapphire substrate, a GaN substrate, a $Ga_2O_3$ substrate, a GaN substrate, and so on may be applied. Needless to say, the present invention is also applicable to another type of semiconductor light-emitting element such as AlGaInP or AlGaAs, for example. Note that the average optical wavelength of the emitted light varies according to the type of light-emitting layer, but as long as the periodic structure A2 is formed at a period which is no greater than the average optical wavelength, a high light extraction efficiency can still be realized. Furthermore, in this embodiment Cu is cited as an example of the material used to form the highly reflective metallic layer, but the highly reflective metallic layer may be consisted of Rh, Ag, Al, Ni, Pt, Cu, an alloy thereof, and so on. By using the highly reflective metallic layer as an electrode, a reduction in the number of fabricating steps can be realized. However, the highly reflective metallic layer and electrode may be formed separately.

(3) Third Embodiment

Figure 9:
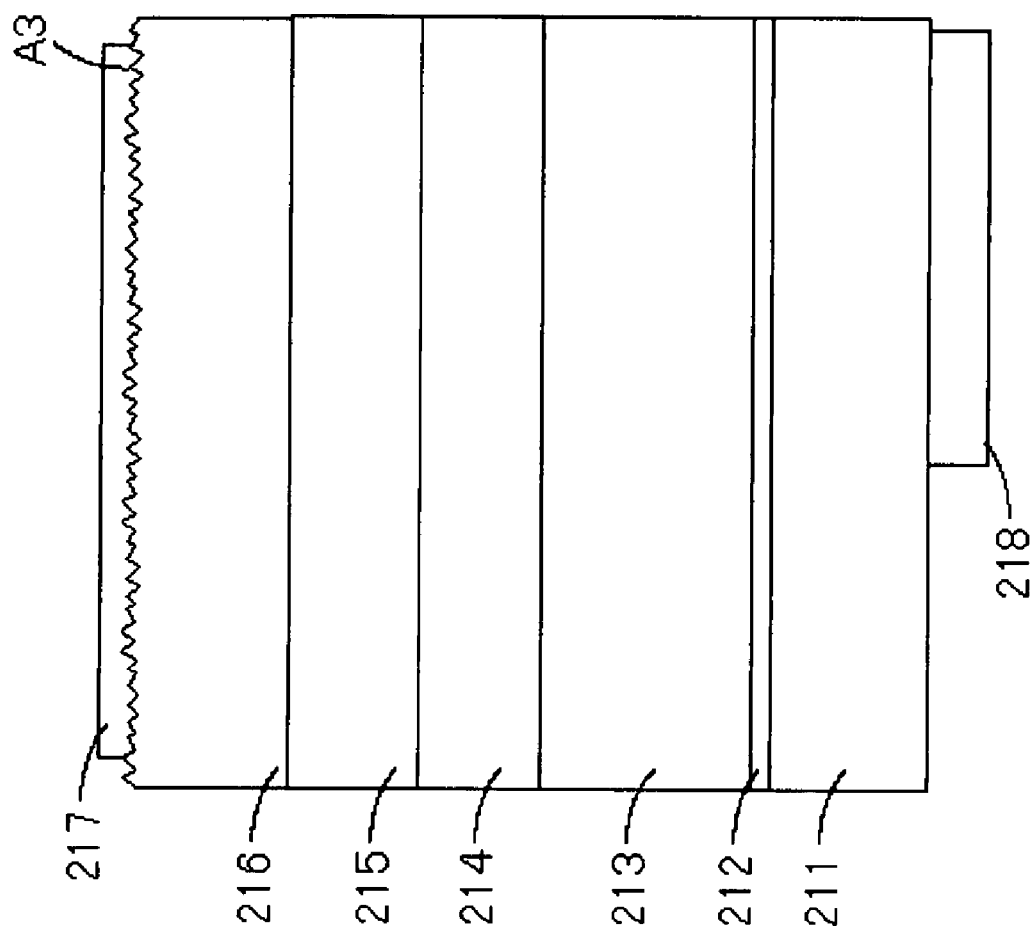
FIG. 9 is an exemplary schematic diagram of a semiconductor light-emitting element according to a third embodiment.

FIG. 9 shows an exemplary outline of the structure of a group III nitride semiconductor light-emitting element as a semiconductor device according to a third embodiment. In the drawing, a semiconductor light-emitting element 210 is constituted by a substrate 211, a low-temperature deposition buffer layer 212, a cladding layer 213, a light-emitting layer 214, a barrier layer 215, a contact layer 216, a p-electrode 217, and an n-electrode 218, all of which are formed in a substantially plate-shaped form. The plate-form substrate 211 constituting the lowermost layer is consisted of SiC. The low-temperature deposition buffer layer 212 consisted of AlGaN, the cladding layer 213 consisted of n-GaN, the light-emitting layer 214 consisted of GaInN, the barrier layer 215 consisted of p-AlGaN, and the contact layer 216 consisted of p-GaN are deposited in succession onto the front side surface of the substrate 211. A periodical structure A3 (with an average period of approximately 200 nm and an average height of 400 nm) is formed by a large number of juts protruding upward from the uppermost contact layer 216. The p-electrode 217 consisted of Cu is deposited onto the periodical structure A3, and the n-electrode 218 is deposited onto the back side of the substrate 211.

With this constitution, light can be emitted from the light-emitting layer 214 by applying a voltage to the semiconductor light-emitting element 210 in a forward bias direction. In the light-emitting layer 214, light is emitted in accordance with the band gap thereof, and the average optical wavelength of the light is approximately 220 nm. The substrate 211, low-temperature deposition buffer layer 212, cladding layer 213, barrier layer 215, and contact layer 216 each possess a translucency, and hence the light emitted by the light-emitting layer 214 can be extracted from the back side of the substrate 211. In other words, the back surface of the substrate 211 serves as a light extraction surface of the semiconductor light-emitting element 210, and the light that is extracted from the extraction surface can be used for illumination and so on.

Meanwhile, the upper surface of the contact layer 216 is covered by the p-electrode 217 consisted of highly reflective Cu, and by reflecting the emitted light, the light can be prevented from leaking from the p-electrode 217 side. The reflected light can be extracted from the light extraction surface and used for illumination and so on. By forming the periodical structure A3, diffuse reflection can be promoted, and hence the reflectance on the interface between the contact layer 216 and the p-electrode 217 can be improved. As a result, the amount of light that is ultimately extracted from the light extraction surface of the semiconductor light-emitting element 210 can be increased, enabling an improvement in the light extraction efficiency.

Next, a fabricating method for the semiconductor light-emitting element 210 will be described. First, the substantially plate-form substrate 211 is prepared. The low-temperature deposition buffer layer 212 is then formed at a predetermined thickness by growing AlGaN uniformly on the front side of the substrate 211 using a metal-organic chemical vapor deposition method. In a similar fashion, the cladding layer 213 is formed on the low-temperature deposition buffer layer 212, and the light-emitting layer 214 and barrier layer 215 are formed on the cladding layer 213. The contact layer 216 is then formed by growing p-GaN on the barrier layer 115.

After depositing the various layers in the manner described above, the periodic structure A3 is formed on the surface of the contact layer 216. A similar method to that of the first embodiment may be applied to form the periodic structure A3, and hence description thereof has been omitted here. Once the periodic structure A3 has been formed, Cu is applied to the surface of the contact layer 216 through vapor deposition. In the initial stage of vapor deposition, the periodic structure A3 forms irregularities on the surface of the contact layer 216, but as vapor deposition progresses, the gaps in the periodic structure A3 are filled by the Cu such that eventually a flat surface is formed as the p-electrode 217. In the previous embodiment, the number of fabricating steps can be reduced by employing the Au particles as the periodic structure A2. In this embodiment, on the other hand, the shape of the periodic structure A3 can be controlled by forming the periodic structure A3 using the Au particles as a periodic mask.

(4) Fourth Embodiment

Figure 10:
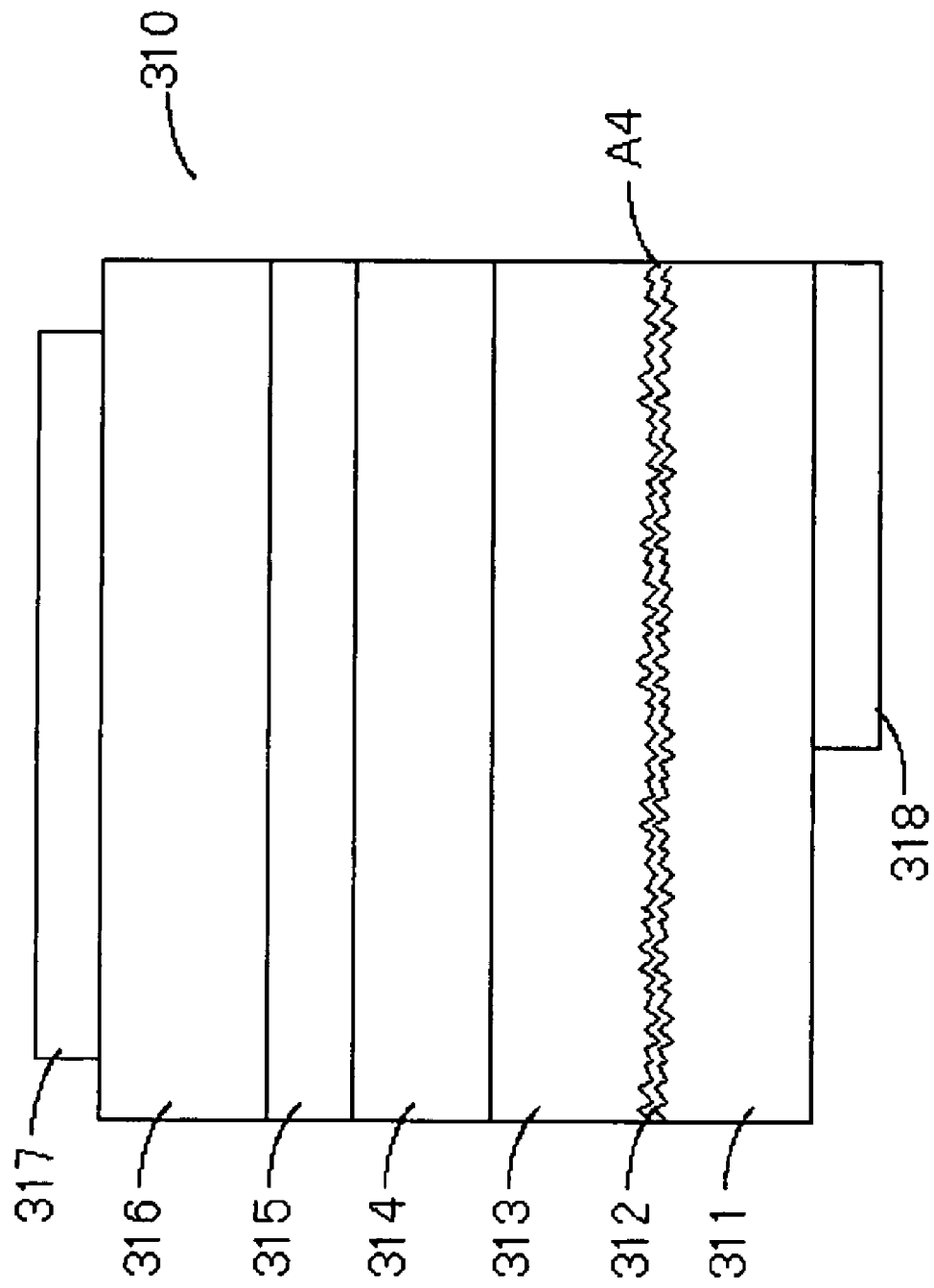
FIG. 10 is an exemplary schematic diagram of a semiconductor light-emitting element according to a fourth embodiment.

FIG. 10 shows an exemplary outline of the structure of a group III nitride semiconductor light-emitting element as a semiconductor device according to a fourth embodiment. In the drawing, a semiconductor light-emitting element 310 is constituted by a substrate 311, a low-temperature deposition buffer layer 312, a cladding layer 313, a light-emitting layer 314, a barrier layer 315, a contact layer 316, a p-electrode 317, and an n-electrode 318, all of which are formed in a substantially plate-shaped form. The plate-form substrate 311 constituting the lowermost layer is consisted of SiC. The low-temperature deposition buffer layer 312 consisted of AlGaN, the cladding layer 313 consisted of n-GaN, the light-emitting layer 314 consisted of GaInN, the barrier layer 315 consisted of p-AlGaN, and the contact layer 316 consisted of p-GaN are deposited in succession onto the front side surface of the substrate 311. The p-electrode 317 is deposited onto the contact layer 316 constituting the uppermost layer, and the n-electrode 318 is deposited onto the back side of the substrate 311.

An indented periodic structure A4 is formed periodically on the front surface side of the substrate 311 as a translucent portion, and the low-temperature deposition buffer layer 312 and cladding layer 313 are formed in alignment with periodic structures 311a, 311a, 311a, . . . . The front surface side of the cladding layer 313 is flat, and all of the layers above the cladding layer 313 are formed to be flat.

By forming the indented periodic structure A4 periodically on the front surface side of the substrate 311 in this manner, reflectance on the interface between the substrate 311 and low-temperature deposition buffer layer 312 can be reduced. The refractive index of the substrate 311 is different to the refractive index of the low-temperature deposition buffer layer 312, but by means of the periodic structure A4, dramatic variation in the refractive index can be suppressed. Further, by forming a layer having a thin film thickness such as the low-temperature deposition buffer layer 312, the irregular form of the periodic structure A4 is maintained, and hence the interface between the low-temperature deposition buffer layer 312 and the cladding layer 313 deposited thereon can also be formed in a periodically indented shape. Accordingly, reflectance on the-interface between the low-temperature deposition buffer layer 312 and the cladding layer 313 can also be reduced.

By forming the periodic structure on a plurality of interfaces in this manner, the light extraction efficiency can be further improved. Further, by forming a thin film layer (the low-temperature deposition buffer layer 312) on the periodic structure A4 at a thickness which does not flatten the periodic structure A4, an irregular shape can be maintained on the surface of the thin film layer (low-temperature deposition buffer layer 312). Accordingly, by depositing an upper layer (the cladding layer 313) on the surface of the thin film layer (low-temperature deposition buffer layer 312) a periodic structure can be formed on the interface between the thin film layer (low-temperature deposition buffer layer 312) and the upper layer (cladding layer 313). In other words, steps for forming periodic structures individually on each interface need not be performed, and a semiconductor light-emitting element having a high light extraction efficiency can be manufactured at a low fabricating cost.

Next, a fabricating method for the semiconductor light-emitting element 310 will be described. First, the substantially plate-form substrate 311 is prepared. Next, the periodic structure A4 is formed on the front side of the substrate 311. A similar method to the method of forming the periodic structure A1 on the back side of the substrate 11 in the first embodiment may be applied to form the periodic structure A4, and hence description thereof has been omitted here. After forming the periodic structure A4, the low-temperature deposition buffer layer 312 is formed in a shape corresponding to the periodic structure A4 by growing AlGaN uniformly on the front side of the substrate 311 using a metal-organic chemical vapor deposition method.

The cladding layer 313 is then formed by growing n-GaN on the front side of the low-temperature deposition buffer layer 312 using a metal-organic chemical vapor deposition method. When the cladding layer 313 has been formed to a certain extent, the recessed portions of the periodic structure A4 are buried by the n-GaN such that ultimately, a flat surface is formed. Once the flat surface of the cladding layer 313 has been formed, the light-emitting layer 314 is formed on the cladding layer 313, and the barrier layer 315 is grown on the light-emitting layer 314. The contact layer 316 is then formed by growing p-GaN on the barrier layer 315. The p-electrode 317 is deposited onto the uppermost contact layer 316, and the n-electrode 318 is deposited onto the back side of the substrate 311.

(5) Fifth Embodiment

Figure 11:
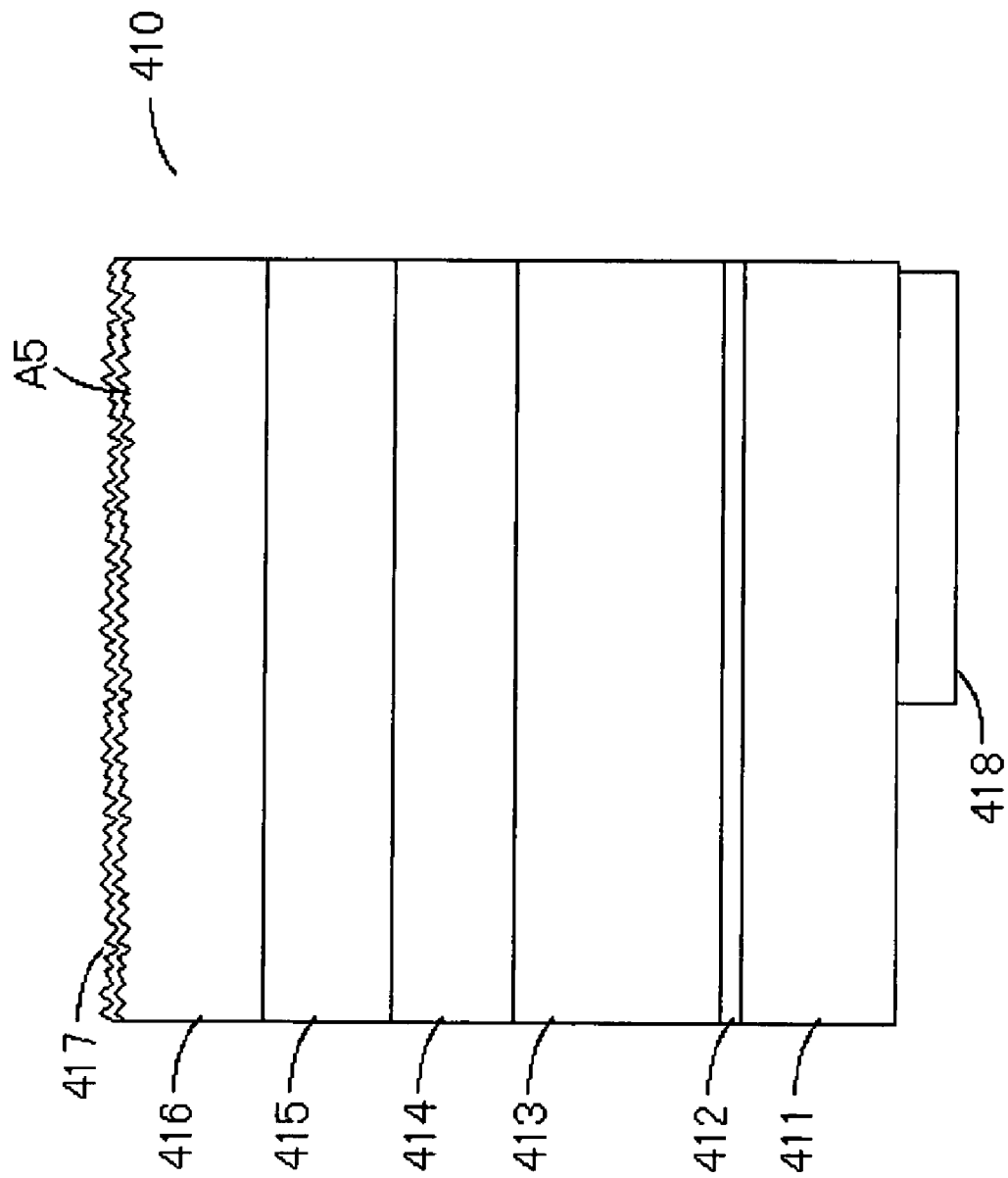
FIG. 11 is an exemplary schematic diagram of a semiconductor light-emitting element according to a fifth embodiment.

FIG. 11 shows an exemplary outline of the structure of a group III nitride semiconductor light-emitting element as a semiconductor device according to a fifth embodiment of the present invention. In the drawing, a semiconductor light-emitting element 410 is constituted by a substrate 411, a low-temperature deposition buffer layer 412, a cladding layer 413, a light-emitting layer 414, a barrier layer 415, a contact layer 416, a p-electrode 417, and an n-electrode 418, all of which are formed in a substantially plate-shaped form. The plate-form substrate 411 constituting the lowermost layer is consisted of SiC. The low-temperature deposition buffer layer 412 consisted of AlGaN, the cladding layer 413 consisted of n-GaN, the light-emitting layer 414 consisted of GaInN, the barrier layer 415 consisted of p-AlGaN, and the contact layer 416 consisted of p-GaN are deposited in succession onto the front side surface of the substrate 411. The p-electrode 417 is deposited onto the contact layer 416, and the n-electrode 418 is deposited onto the back side of the substrate 411. Note that the p-electrode 417 is consisted of transparent mesh-form Ni/Au or the like, and is capable of transmitting light. The p-electrode 417 may employ a transparent electrode made of $Ga_2O_3$, ZnO, ITO, or the like, as long as it is capable of transmitting light to a certain extent.

The substrate 411, low-temperature deposition buffer layer 412, cladding layer 413, light-emitting layer 414, barrier layer 415, contact layer 416, and n-electrode 418 are deposited in flat plate form. An indented periodic structure A5 is formed periodically on the surface of the contact layer 416, and the p-electrode 417 is deposited onto the periodic structure A5 so as to follow the indentations of the periodic structure A5. The surface of the p-electrode 417 is formed so as to maintain the irregularities of the periodic structure A5.

By forming the indented periodic structure A5 periodically on the front side of the contact layer 416 in this manner, reflectance on the interface between the contact layer 416 and the p-electrode 417 can be reduced. The refractive index of the contact layer 416 is different to the refractive index of the p-electrode 417, but by means of the periodic structure A5, dramatic variation in the refractive index can be suppressed. Further, by forming a layer having a thin film thickness such as the p-electrode 417, the irregular form of the periodic structure A5 is maintained, and hence the interface between the p-electrode 417 and the air can also be formed in a periodically indented shape. Accordingly, reflectance on the interface between the p-electrode 417 and the air can also be reduced.

Next, a fabricating method for the semiconductor light-emitting element 410 will be described. First, the substantially plate-form substrate 411 is prepared. Next, the low-temperature deposition buffer layer 412 is formed by growing AlGaN uniformly on the front side of the substrate 411 using a metal-organic chemical vapor deposition method. The cladding layer 413 is then formed by growing n-GaN on the front side of the low-temperature deposition buffer layer 412 using a metal-organic chemical vapor deposition method. The light-emitting layer 414 is then formed on the cladding layer 413, and the barrier layer 415 is formed on the light-emitting layer 414. The contact layer 416 is then formed by growing p-GaN on the barrier layer 415.

The indented periodic structure A5 is then formed periodically on the contact layer 416 as a translucent portion. A similar method to the method used to form the periodic structure A1 on the back side of the substrate 11 in the first embodiment may be applied to form the periodic structure A5, and hence description thereof has been omitted here. After forming the periodic structure A5, the p-electrode 417 is deposited onto the periodic structure A5 through coating or vapor deposition. Meanwhile, the n-electrode 418 is deposited onto the back side of the substrate 411.

(6) Sixth Embodiment

Figure 12:
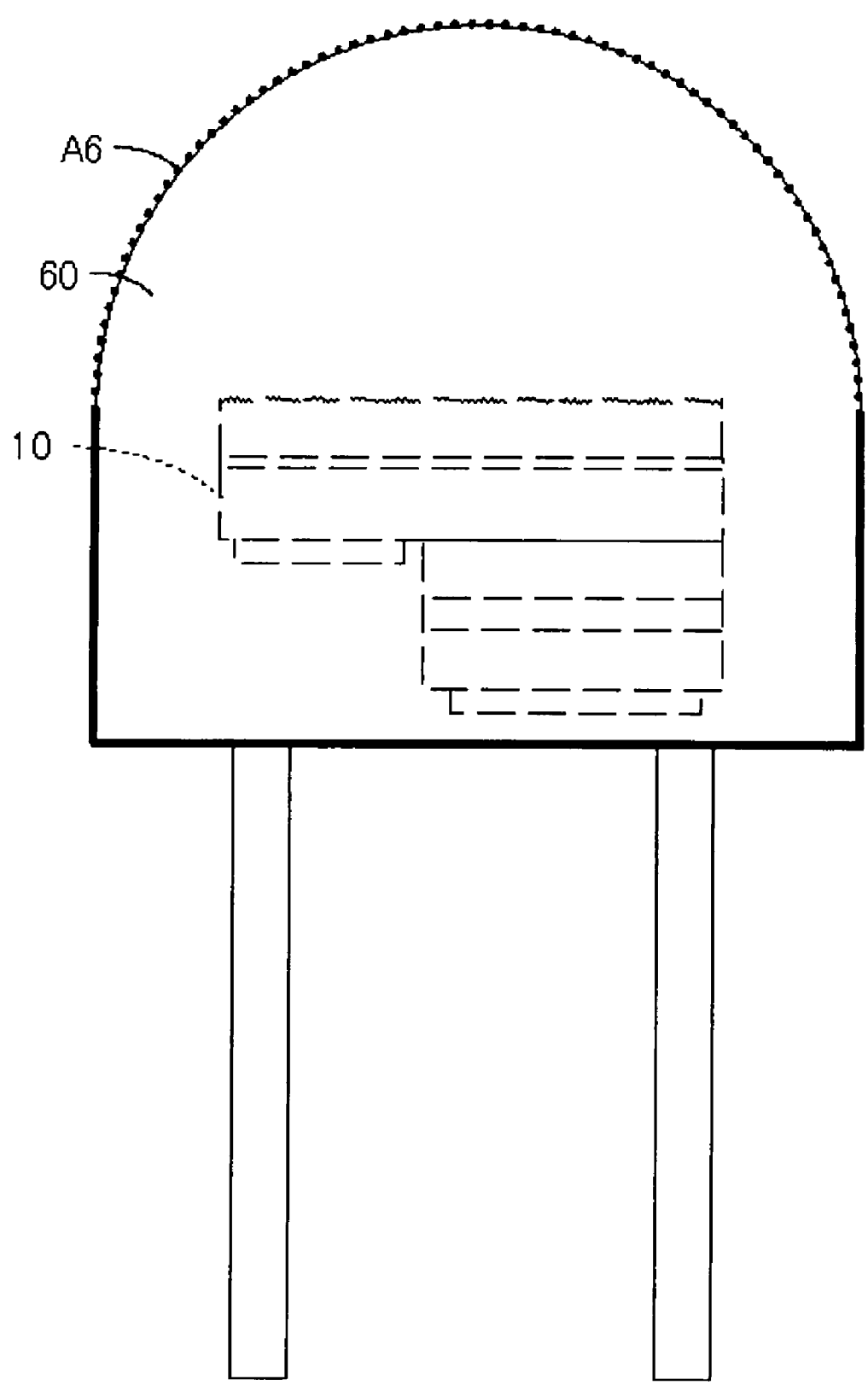
FIG. 12 is an exemplary schematic diagram of a semiconductor light-emitting element according to a sixth embodiment.

FIG. 12 shows an exemplary outline of the structure of a group III nitride semiconductor light-emitting element according to a sixth embodiment. In the drawing, a hemispherical dome-shaped sealing portion 60 is formed, and the semiconductor light-emitting element 10 of the first embodiment is buried within the interior of the sealing portion 60 such that the light extraction surface is oriented upward on the paper surface. The sealing portion 60 is consisted of a synthetic resin such as transparent epoxy resin, and is capable of transmitting light emitted from the semiconductor light-emitting element 10 to the outside. The surface of the sealing portion 60 as a translucent portion is formed with a periodically indented periodic structure A6. A similar method to the method used to form the periodic structure A1 on the back side of the substrate 11 in the first embodiment may be applied to form the periodic structure A6, and hence description thereof has been omitted here.

By forming the indented periodic structure A6 periodically on the surface of the sealing portion 60 in this manner, reflectance on the interface between the sealing portion 60 and the outside air can be reduced. The refractive index of the air is different from that of the sealing portion 60, but by means of the periodic structure A6, dramatic variation in the refractive index can be suppressed. Note that the semiconductor light-emitting element 10 may be sealed in the sealing portion 60 in various ways, and only the light extraction surface may be sealed in the sealing portion 60. In this case also, the efficiency with which light is extracted to the outside of the sealing portion 60 can be improved by forming the periodic structure A6 on the surface of the sealing portion 60.

SUMMARY

According to the present invention described above, by forming the periodic structure A1 on the light extraction surface of the semiconductor light-emitting element 10 in a period which is double the average optical wavelength of the light or less, the refractive index difference on the light extraction surface can be reduced. As a result, reflection on the light extraction surface can be prevented, enabling the realization of a high light extraction efficiency. Furthermore, a fine periodic mask can be formed by heating an Au thin film, and therefore the periodic structure A1 can be formed easily and at low cost.

Further, a semiconductor light-emitting element may be formed by combining the various embodiments appropriately. For example, the semiconductor light-emitting elements of the first through fifth embodiments may be sealed inside the sealing portion 60 of the sixth embodiment. Further, a semiconductor light-emitting element may be formed by combining the constitution of the first embodiment with the constitution of the second or third embodiment, for example. According to this constitution, high reflectance can be realized on the opposite surface of the light-emitting portion to the light extraction surface while realizing high transmittance on the light extraction surface, and hence the light extraction efficiency can be improved synergistically. Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. For example, the material of the substrate can be changed. Such variations and alternate embodiments are contemplated, and can be made without departing from the spirit and scope of the invention.

What is claimed is:

1. A semiconductor device, comprising:
   a translucent portion having a first semiconductor layer that has a first side and a second side;
   the first side of the first semiconductor layer is comprised of a first uniformly distributed periodic structure;
   a light emitting portion that contacts the first side and is comprised of:
   a thin coating of low temperature deposition buffer layer deposited onto the first side that mimics and parallels the first uniformly distributed periodic structure;
   the low temperature deposition buffer layer includes a second buffer side that contacts the first side of the first semiconductor layer, forming a second uniformly distributed periodic structure;
   the low temperature deposition buffer layer further includes a first buffer side forming a third uniformly distributed periodic structure, with the first buffer side contacting a second cladding side of a cladding layer, with the second cladding side forming a fourth uniformly distributed periodic structure as a result of contact with the first buffer side of the low temperature deposition buffer layer;
   a light emitting layer that contacts a first cladding side of the cladding layer;
   a barrier layer that contacts the light emitting layer;
   a contact layer that contacts the barrier layer;
   a p-electrode that contacts the contact layer; and
   a n-electrode that contacts the second side of the first semiconductor layer;
   with the first, the second, the third, and the fourth uniformly distributed periodic structure having an effective refractive index that converges gradually towards a second refractive index from a first refractive index as light emitted advances and penetrates more deeply in a height direction of one uniformly distributed periodic structure towards another uniformly distributed periodic structure, which improves transmittance of light by suppressing variations in first and second refractive indexes;
   with light ultimately extracted from the second side of the first semiconductor layer.

* * * * *